US008610124B2

(12) United States Patent
Ro et al.

(10) Patent No.: US 8,610,124 B2
(45) Date of Patent: Dec. 17, 2013

(54) DISPLAY DEVICE AND METHOD OF MANUFACTURING THE SAME

(75) Inventors: Sung-In Ro, Yongin (KR); Ji-Yong Park, Yongin (KR); Kyung-Min Park, Yongin (KR); Seong-Yeun Kang, Yongin (KR); Jin-Suk Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 220 days.

(21) Appl. No.: 13/079,979

(22) Filed: Apr. 5, 2011

(65) Prior Publication Data
US 2011/0241005 A1 Oct. 6, 2011

(30) Foreign Application Priority Data
Apr. 5, 2010 (KR) .................. 10-2010-0030922

(51) Int. Cl.
*H01L 29/04* (2006.01)
(52) U.S. Cl.
USPC ............... 257/59; 257/72; 257/40; 257/353; 257/E51.006; 438/82; 438/98; 438/149

(58) Field of Classification Search
USPC ................. 257/59, 72, E29.003, E29.282, 257/E21.413; 438/34, 29
See application file for complete search history.

(56) References Cited

U.S. PATENT DOCUMENTS

| 2002/0117671 A1* | 8/2002 | Tateishi | 257/72 |
| 2009/0014721 A1* | 1/2009 | Tanabe | 257/59 |
| 2009/0303427 A1 | 12/2009 | Kondo et al. | |
| 2010/0053514 A1 | 3/2010 | Chuang | |

FOREIGN PATENT DOCUMENTS

KR 1020060100903 A 9/2006
KR 1020080055195 A 6/2008

* cited by examiner

*Primary Examiner* — Tu-Tu Ho
(74) *Attorney, Agent, or Firm* — Robert E. Bushnell, Esq.

(57) ABSTRACT

A display device capable of implementing the light shielding effect and process simplification, and a method of manufacturing the display device. The display device includes a transistor formed in a first region on a substrate, a pixel electrode formed in a second region on the substrate, a buffer layer formed beneath the transistor in the first region, and a light shielding layer formed between the buffer layer and the substrate in the first region. In the display device, the light shielding layer may include a semiconductor material.

10 Claims, 8 Drawing Sheets

DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 5 Apr. 2010 and there duly assigned Serial No. 10-2010-0030922.

BACKGROUND OF THE INVENTION

1. Field of the Invention

An aspect of the present invention relates to a flat panel display device, and more particularly, to a display device and a method of manufacturing the same.

2. Description of the Related Art

Recently, there have been developed various types of flat panel display devices capable of reducing the weight and volume of cathode ray tubes, which are disadvantages.

SUMMARY OF THE INVENTION

It is therefore an aspect of the present invention to provide an improved display device.

It is another aspect of the present invention to provide a display device capable of implementing the light shielding effect and process simplification.

It is still another aspect of the present invention to provide a method of manufacturing the display device.

According to an aspect of the present invention, there is provided a display device including a transistor positioned in a first region on a substrate, an electrode positioned in a second region on the substrate to be electrically connected to the transistor, and a light shielding layer formed below the transistor in the first region. The light shielding layer may be formed of a semiconductor material.

The transistor may include a semiconductor layer having source, channel and drain regions, a gate electrode spaced apart from the channel region while disposed in correspondence with the channel region, and a gate insulating layer positioned between the channel region and the gate electrode. The light shielding layer may be formed of a material identical to a semiconductor material included in the semiconductor layer.

The display device may further include a buffer layer positioned between the semiconductor layer and the light shielding layer. The semiconductor material may be poly-silicon. Alternatively, the semiconductor material may be amorphous silicon.

According to an aspect of the present invention, there is provided a display device including a transistor positioned in a first region on a substrate, an electrode positioned in a second region on the substrate to be electrically connected to the transistor, and a light shielding layer formed below the transistor in the first region. The transistor includes a semiconductor layer having source, channel and drain regions, a gate electrode spaced apart from the channel region while disposed in correspondence with the channel region, and a gate insulating layer positioned between the channel region and the gate electrode. A side etched surface of the light shielding layer may be disposed in the same plane with a side etched surface of the semiconductor layer.

The display device may further include a buffer layer positioned between the semiconductor layer and the light shielding layer. A side etched surface of the buffer layer may be disposed in the same plane with the side etched surface of the light shielding layer and the side etched surface of the semiconductor layer.

According to an aspect of the present invention, there is provided a method of manufacturing a display device. In the method, a first amorphous silicon layer, a buffer layer and a second amorphous silicon layer are sequentially formed on a substrate. A crystallization process is performed with respect to the second amorphous silicon layer, thereby forming the second amorphous silicon layer into a poly-silicon layer. The first amorphous silicon layer, the buffer layer and the poly-silicon layer are patterned through an etching process, thereby forming a light shielding layer from the first amorphous silicon layer, and a semiconductor layer from the poly-silicon layer. The light shielding layer, the buffer layer and the semiconductor layer are disposed in a first region on the substrate. A gate electrode is formed in a region overlapped with the semiconductor layer, and source and drain electrodes are formed to electrically contact source and drain regions of the semiconductor layer, respectively. A pixel electrode is formed to be positioned in a second region on the substrate and to be electrically connected to the drain electrode.

The crystallization process may be performed using excimer laser annealing (ELA), sequential lateral solidification (SLS), metal induced crystallization (MIC) or metal induced lateral crystallization (MILC). The first amorphous silicon layer. The patterned first amorphous silicon layer, the buffer layer and the poly-silicon layer may remain in the first region in which the transistor is formed through the etching process, and the substrate may be exposed in the second region that is a transmission region. The patterned first amorphous silicon layer may become the light shielding layer, and the patterned poly-silicon layer may become the semiconductor layer of the transistor.

According to an aspect of the present invention, there is provided a method of manufacturing a display device. In the method, a first amorphous silicon layer is formed on a substrate, and the first amorphous silicon layer is formed into a first poly-silicon layer through a crystallization process. A buffer layer and a second amorphous silicon layer are sequentially formed on the first poly-silicon layer. A crystallization process is performed with respect to the second amorphous silicon layer, thereby forming the second amorphous silicon layer into a second poly-silicon layer. The first poly-silicon layer, the buffer layer and the second poly-silicon layer are patterned through an etching process, thereby forming a light shielding layer, the buffer layer and a semiconductor layer in a first region on the substrate. A gate electrode is formed in a region overlapped with the semiconductor layer, and source and drain electrodes are formed to electrically contact with source and drain regions of the semiconductor layer. A pixel electrode is formed to be positioned in a second region on the substrate and to be electrically connected to the drain electrode.

The crystallization process may be performed using ELA, SLS, MIC or MILC. The first poly-silicon layer, the buffer layer and the second poly-silicon layer may remain in the first region in which the transistor is formed through the etching process, and the substrate may be exposed in the second region that is a transmission region. The patterned first poly-silicon layer may become the light shielding layer, and the patterned second poly-silicon layer may become the semiconductor layer of the transistor.

According to embodiments of the present invention, a light shielding layer is formed of a non-metallic material, so that it is possible to prevent damage caused by static electricity or the like. Also, the light emitting layer is simultaneously formed with a channel region, so that manufacturing processes can be simplified.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
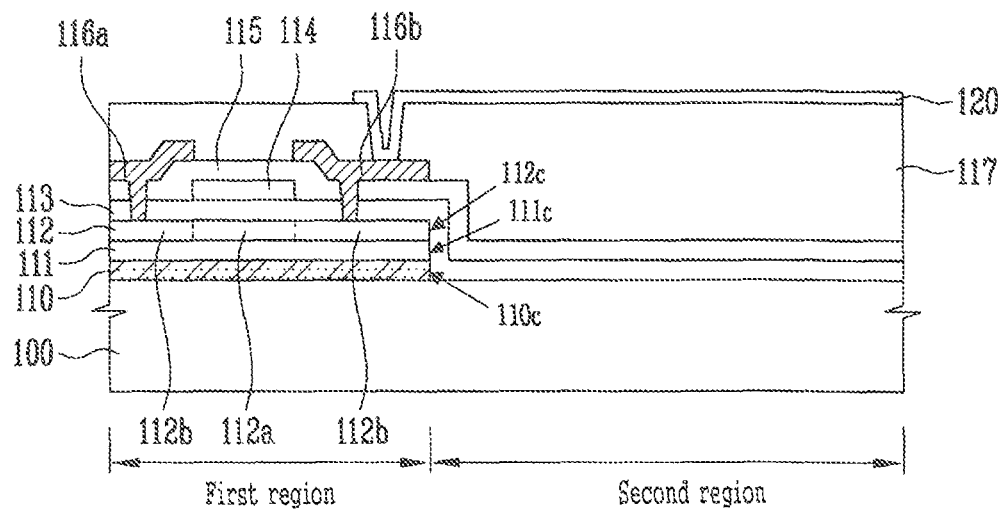
FIG. 1 is a sectional view of a display device constructed as an embodiment according to the principles of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Flat panel display devices include a liquid crystal display device, a field emission display device, a plasma display panel, an organic light emitting display device, and the like.

Particularly, display devices are advantageous in compact size, lightweight, low power consumption and the like, and are generally configured as active matrix type display devices. In an active matrix type display device, pixels arranged in a matrix form are defined by intersecting a plurality of scan lines with a plurality of data lines, and a transistor that is a switching element is provided to each of the pixels.

The transistor includes a semiconductor layer having a channel region, a gate electrode and source and drain electrodes. When light is incident into the channel region of the transistor, electron-hole pairs are produced in the channel region. The produced electron-hole pairs may rapidly generate photo leakage current, and the generated photo leakage current may have a fatal influence on the quality of the image displayed by the display device.

Hereinafter, a medium- or small-sized display device and a method of manufacturing the same according to embodiments of the present invention will be described with respect to the accompanying drawings. i) Shapes, sizes, rates, angles, numbers and the like illustrated in the accompanying drawings are illustrative, and may be modified to some extent. ii) Since the drawings are illustrated at observer's sight, directions or positions in which the drawings are described may be variously modified depending on observer's positions. iii) Like reference numerals may be used to indicate like parts throughout the drawings. iv) When the terms 'comprise', 'have', 'include' and the like are used, other parts may be added as long as the term 'only' is not used. v) The singular forms may be interpreted as the plural forms. vi) Although the terms 'about', 'substantially' and the like are not used, shapes, comparisons between sizes, relations between positions, and the like are interpreted to include an ordinary error range. vii) Although the terms 'after', 'before', 'subsequently', 'also', 'here', 'at this time' and the like are used, they are not used to limit temporal positions. viii) The terms 'first', 'second', 'third' and the like are selectively, mutually or repeatedly used for distinguishing between similar elements and not used as confined meanings. ix) When the position relation between two parts is described using the terms 'on', 'above', 'below', 'next' and the like, one or more parts may be positioned between the two parts as long as the term 'immediately' is not used. x) When parts are linked by the term 'or', they are interpreted individually or in combination, but when they are linked by the term 'or one of', they are only interpreted individually.

Display Device

FIG. 1 is a sectional view of a display device constructed an embodiment according to the principles of the present invention.

For convenience of illustration, a pixel region of a lower substrate defined by gate lines (not shown) and data lines (not shown), i.e., a lower substrate including a transistor and a pixel electrode, is illustrated in the embodiment shown in FIG. 1.

Referring to FIG. 1, the display device according to the embodiment of the present invention includes a lower substrate 100, a transistor (TFT) formed in a first region of lower substrate 100, and an electrode 120 formed in a second region of lower substrate 100. Here, electrode 120 may be a pixel electrode.

According to this embodiment, electrode 120 of a liquid crystal display device has been described as an example. In case of an organic light emitting display device, however, the electrode may be an anode or cathode electrode.

In FIG. 1, the transistor with a top gate structure in which a semiconductor layer 112 is made of poly-silicon will be described as an example.

That is, the transistor includes a semiconductor layer 112 made of poly-silicon (poly-Si), a gate electrode 114 formed in a region overlapped with semiconductor layer 112, source and drain electrodes 116a and 116b that come in contact with regions of semiconductor layer 112, respectively.

First, semiconductor layer 112 is formed on a buffer layer 111 formed in the first region of lower substrate 100.

More specifically, semiconductor layer 112 made of the poly-silicon may be formed by depositing an amorphous silicon layer and then crystallizing the amorphous silicon layer into a poly-silicon layer through a crystallization process including excimer laser annealing (ELA) using excimer laser, sequential lateral solidification (SLS) crystallization or heat treatment, metal induced lateral crystallization (MILC), or the like. Semiconductor layer 112 may have an active region 112a containing pure poly-silicon at the center of semiconductor layer 112, and source and drain regions 112b doped at both sides of active region 112a.

A first insulating layer 113 is formed on semiconductor layer 112. Gate electrode 114 is formed on first insulating layer 113 and is overlapped with the active region 112a.

A second insulating layer 115 is formed on lower substrate 100 including gate electrode 114. Source and drain electrodes 116a and 116b are formed on upper portions of second insulating layer 115, and are overlapped with the source and drain regions 112b of semiconductor layer 112, respectively. At this time, source and drain electrodes 116a and 116b are electrically connected to source and drain regions 112b through contact holes, respectively. The contact holes are formed in first and second insulating layers 113 and 115, and are disposed in correspondence with source and drain regions 112b.

A third insulating layer 117 is formed on source and drain electrodes 116a and 116b. A contact hole is formed in a partial region of third insulating layer 117 and is overlapped with the drain electrode 116b, so that an electrode 120 made of a transparent conductive material is electrically connected to drain electrode 116b of the transistor through the contact hole. As shown in this figure, electrode 120 is formed in the second region that is a transmission region.

In the display device, light incident from a backlight (not shown) positioned below lower substrate 100 is transmitted through the second region that is the transmission region, and displays an image.

Since the transistor includes an opaque metal, light is not transmitted through the first region in which the transistor is formed.

The light provided from the backlight disposed below lower substrate 100 is, however, also incident into the transistor. In this case, as described above, the light is incident into active region 112a of semiconductor layer 112 that constitutes the transistor, and therefore, leakage current may be induced.

In the case of the liquid crystal display device, the light may be light provided from the backlight. Embodiments of the present invention are not, however, limited to the light provided from the backlight, but may include any kind of light provided below the substrate in the organic light emitting display device.

Accordingly, there has been proposed a method of forming a light shielding layer so as to shield light incident from the backlight blow semiconductor layer 112. In the case of the related art, the light shielding layer is formed of an opaque metallic material.

When the light shielding layer is formed of an opaque metallic material, however, the crystallization rate in the crystallization process of the semiconductor layer of the transistor is lowered due to the properties of the metallic material with high thermal conductivity and electrical conductivity, and the transistor is damaged due to generation of static electricity.

In this embodiment, in order to overcome such a disadvantage, the light shielding layer is formed of a silicon material like the semiconductor layer.

In this embodiment, light shielding layer 110 is formed of amorphous silicon or poly-silicon. Since light shielding layer 110 has a thermal conductivity and an electrical conductivity lower than those of the related art light shielding layer formed of a metallic material, the disadvantage of the related art light shielding layer can be overcome.

In the embodiments of the present invention, a semiconductor material including silicon such as amorphous silicon or poly-silicon has been described as an example, but it is sufficient to use a semiconductor material capable of forming a channel in a general transistor. For example, the semiconductor material may be a metal oxide material, organic material or the like.

When light shielding layer 110 is formed of the same poly-silicon layer as semiconductor layer 112, light shielding layer 110 absorbs light with the same absorption wavelength band as the light applied to active region 112a of semiconductor layer 112, thereby obtaining a more effective light shielding effect. As shown in this figure, light shielding layer 110 may be formed beneath buffer layer 111 and overlapped with the first region.

Referring back to FIG. 1, semiconductor layer 112 and buffer layer 111 have the same side etched surface. The side etched surface may be formed through the same etching process. That is, a side surface 112c of semiconductor layer 112 and a side surface 111c of buffer layer 111 may be disposed in the same plane and may be formed together simultaneously through an etching process. Thus, it is possible to prevent the lowering of the light transmittance, which may be generated when buffer layer 111 is positioned in the light transmittance region, which is the second region. Light shielding layer 110 may also have the same side etched surface as semiconductor layer 112 and buffer layer 111. That is, a side surface 110c of light shielding layer 110 may be disposed in the same plane with side surface 112c of semiconductor layer 112 and side surface 111c of buffer layer 111, and may be formed together and simultaneously with side surface 112c of semiconductor layer 112 and side surface 111c of buffer layer 111, through the etching process. Since light shielding layer 110 has a lower light transmittance than buffer layer 111, a portion of light shielding layer 110 positioned in the light transmittance region, which is the second region, is selectively removed, thereby improving the light transmittance.

Method of Manufacturing Display Device

Hereinafter, methods of manufacturing a display device according to embodiments of the present invention will be described with reference to FIGS. 2 to 3.

Figure 5:
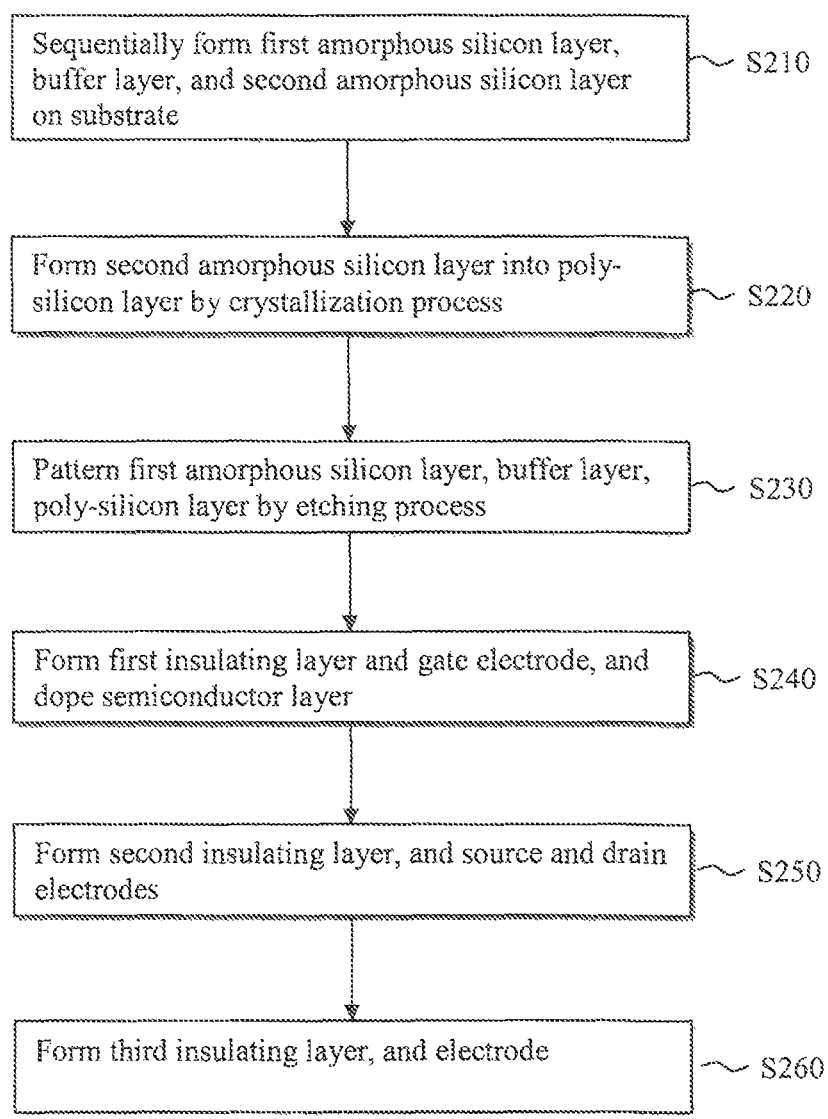
FIG. 5 is a flow chart of a method of manufacturing the display device shown in FIG. 1.

FIGS. 2A to 2F are sectional views illustrating a method of manufacturing the display device shown in FIG. 1, and FIG. 5 is a flow chart of the method of manufacturing the display device shown in FIG. 1, as an embodiment according to the principles of the present invention.

Figure 2A:
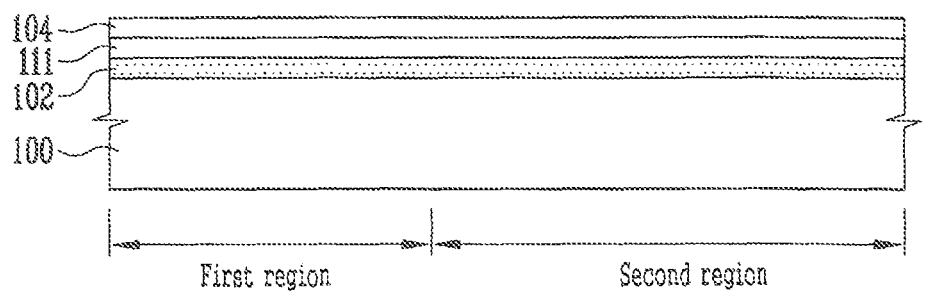
FIGS. 2A to 2F are sectional views illustrating a method of manufacturing the display device shown in FIG. 1 as an embodiment according to the principles of the present invention.

Referring to FIG. 2A, a first amorphous silicon layer 102, a buffer layer 111 and a second amorphous silicon layer 104 are sequentially formed on a substrate 100 (step 210).

At this time, buffer layer 111 functions to protect a transistor from impurities discharged from substrate 100. Buffer layer 111 may be a silicon nitride layer or silicon oxide layer.

Figure 2B:
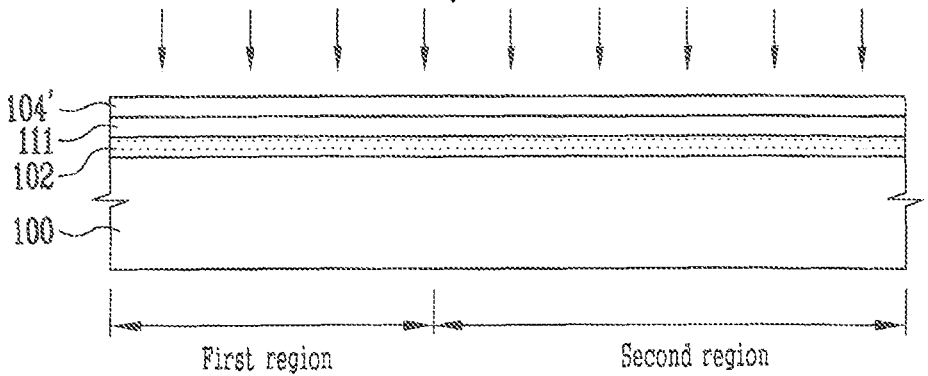

Referring to FIG. 2B, second amorphous silicon layer 104 is formed into a poly-silicon layer 104' by performing a crystallization process with respect thereto (step 220).

The crystallization process includes excimer laser annealing (ELA), sequential lateral solidification (SLS), metal induced crystallization (MIC), or metal induced lateral crystallization (MILC).

Figure 2C:
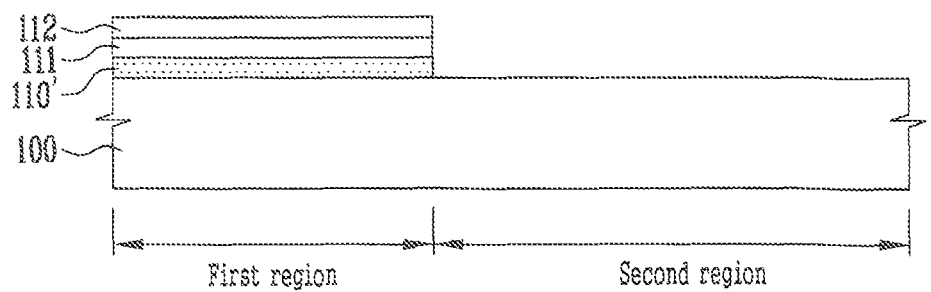

Referring to FIG. 2C, first amorphous silicon layer 102, buffer layer 111, poly-silicon layer 104' are patterned through an etching process (step 230). Through the etching process, first amorphous silicon layer 102, buffer layer 111, poly-silicon layer 104' remain in the first region in which a transistor is formed, and substrate 100 is exposed in the second region that is a transmission region.

The patterned first amorphous silicon layer 102 serves as a light shielding layer 110'. The patterned poly-silicon layer 104' becomes a semiconductor layer 112 of the transistor.

According to the embodiment of the present invention, it is possible to remove buffer layer 111 that causes the lowering of transmittance in the second region that is the transmission region, thereby improving the transmittance of the display device.

Also, light shielding layer 110' is formed through the same etching process together with semiconductor layer 112, so that an additional mask process can be removed as compared with the related art process of forming a light shielding layer. Therefore, it is advantageous in view of process simplification.

Figure 2D:
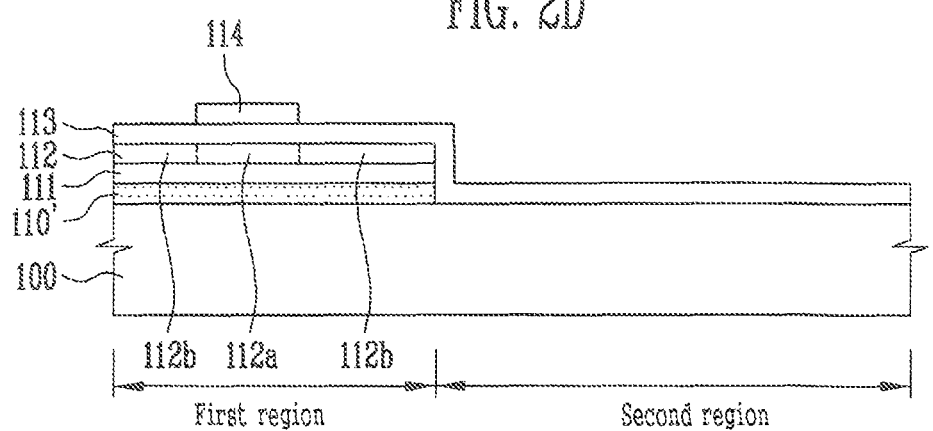

Referring to FIG. 2D, a first insulating layer 113 is formed on the entire surface of substrate 100 on which semiconductor layer 112 is formed. A gate electrode 114 is formed on first insulating layer 113 overlapped with semiconductor layer 112 (step 240).

A doping process is performed using gate electrode 114 as a mask. Accordingly, semiconductor layer 112 is formed with an active region 112a overlapped with gate electrode 114, and source and drain regions 112b doped at both sides of active region 112a (step 240).

Figure 2E:
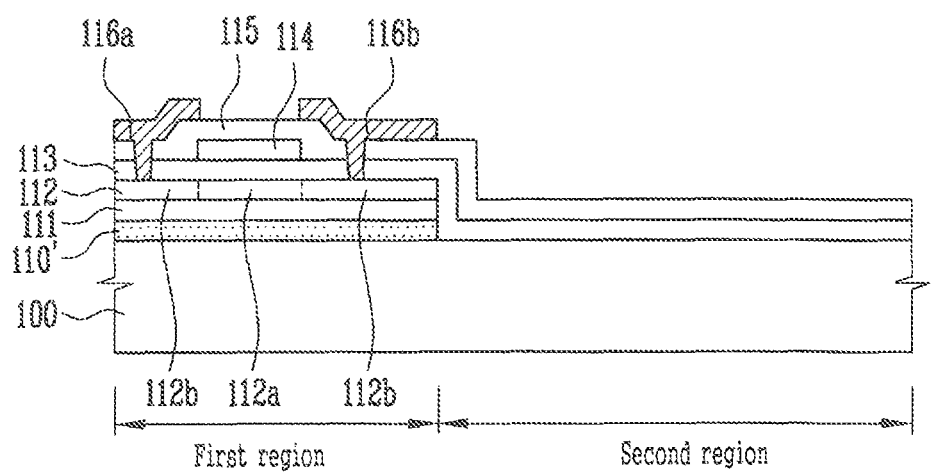

Referring to FIG. 2E, a second insulating layer 115 is formed on substrate 100 on which gate electrode 114 is formed. Source and drain electrodes 116a and 116b are formed on upper portions of second insulating layer 115, and are overlapped with source and drain regions 112b of semiconductor layer 112, respectively (step 250). At this time, source and drain electrodes 116a and 116b are electrically connected to source and drain regions 112b through contact holes corresponding to source and drain regions 112b in first and second insulating layers 113 and 115, respectively.

Figure 2F:
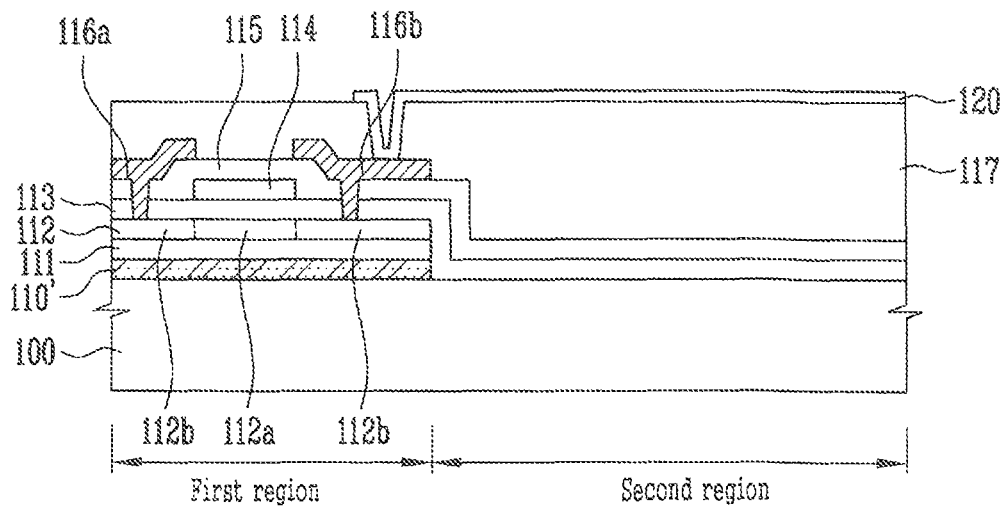

Referring to FIG. 2F, a third insulating layer 117 is formed on source and drain electrodes 116a and 116b. A contact hole is formed in a partial region of third insulating layer 117 and is overlapped with drain electrode 116b, so that an electrode 120 made of a transparent conductive material is electrically connected to drain electrode 116b of the transistor through the contact hole (step 260). At this time, electrode 120 is formed in a second area that is a transmission region as shown in this figure.

Figure 6:
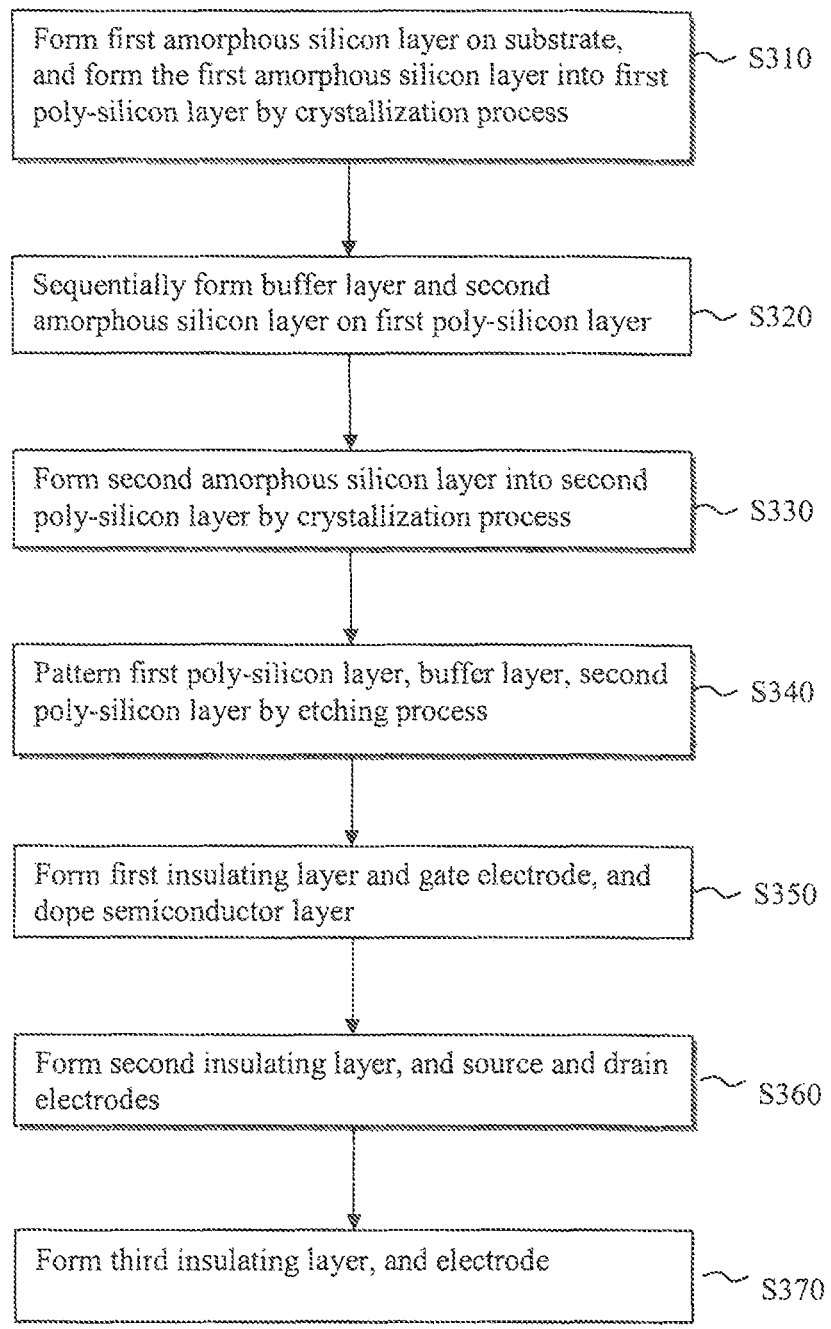
FIG. 6 is a flow chart of another method of manufacturing the display device shown in FIG. 1.

FIGS. 3A to 3G are sectional view illustrating a method of manufacturing a display device, and FIG. 6 is a flow chart of the method of manufacturing the display device shown in FIG. 1, as another embodiment according to the principles of the present invention. FIG. 4 is a graph showing transmittances of poly-silicon and amorphous silicon.

When comparing this embodiment with the embodiment shown in FIG. 2, this embodiment is different from the embodiment shown in FIG. 2 in that a light shielding layer is formed of poly silicon like a semiconductor layer of a transistor. That is, both the light shielding layer and the semiconductor layer of the transistor are formed of poly silicon. Therefore, components identical to those of FIG. 2 are designated by like reference numerals.

Figure 3A:
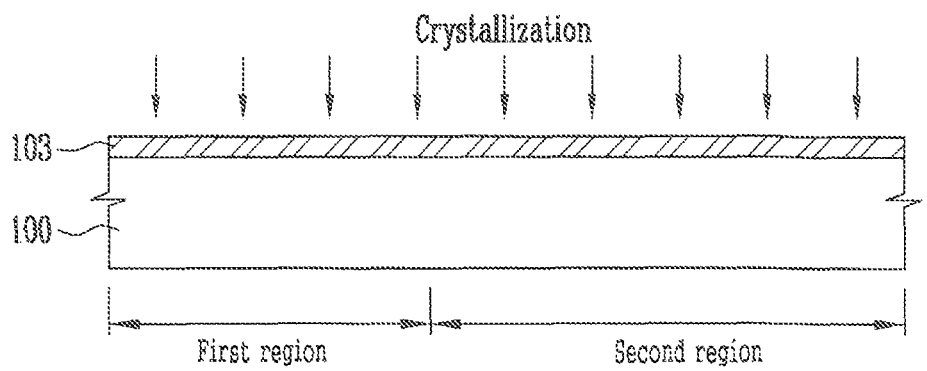
FIGS. 3A to 3G are sectional views illustrating a method of manufacturing a display device according to another embodiment of the present invention.
Figure 4:
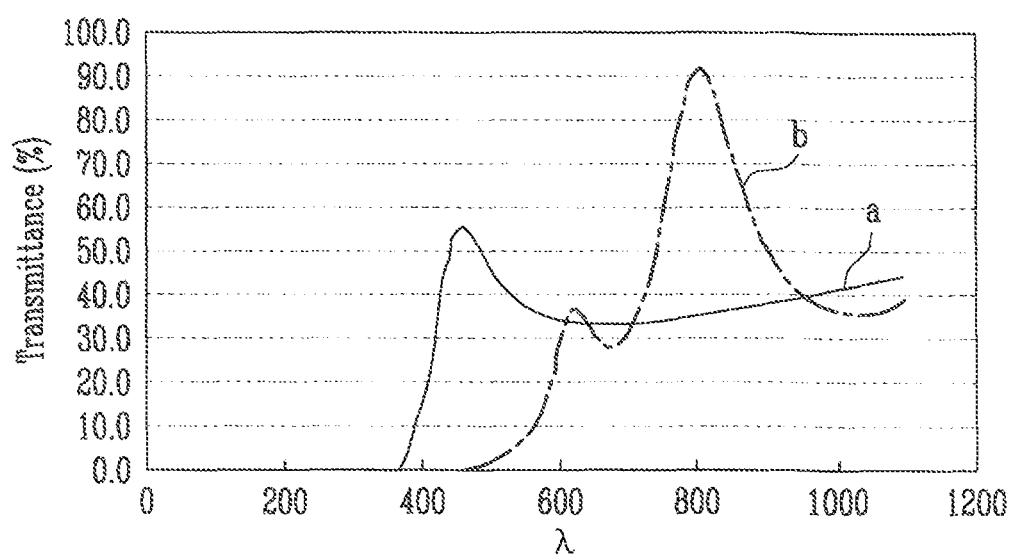
FIG. 4 is a graph showing transmittances of poly-silicon and amorphous silicon.

Referring to FIG. 3A, a first amorphous silicon layer (see reference numeral 102 of FIG. 2A) is formed on a substrate 100. Then, the first amorphous silicon layer is formed into a first poly-silicon layer 103 by performing a crystallization process with respect thereto (step 310).

Figure 3B:
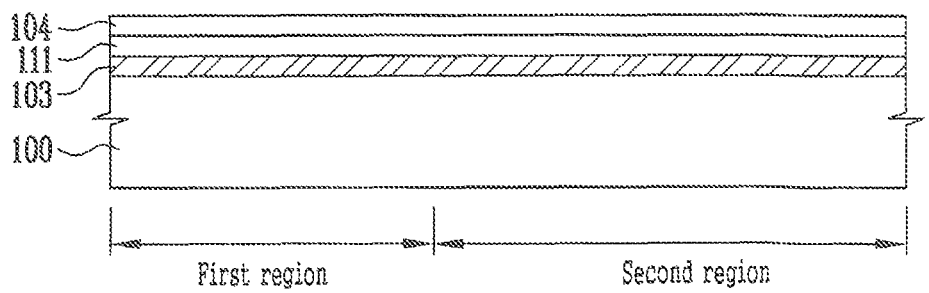

Referring to FIG. 3B, a buffer layer 111 and a second amorphous silicon layer 104 are sequentially formed on first poly-silicon layer 103 (step 320). Buffer layer 111 functions to protect a transistor from impurities discharged from substrate 100. buffer layer 111 may be a silicon nitride layer or silicon oxide layer.

Figure 3C:
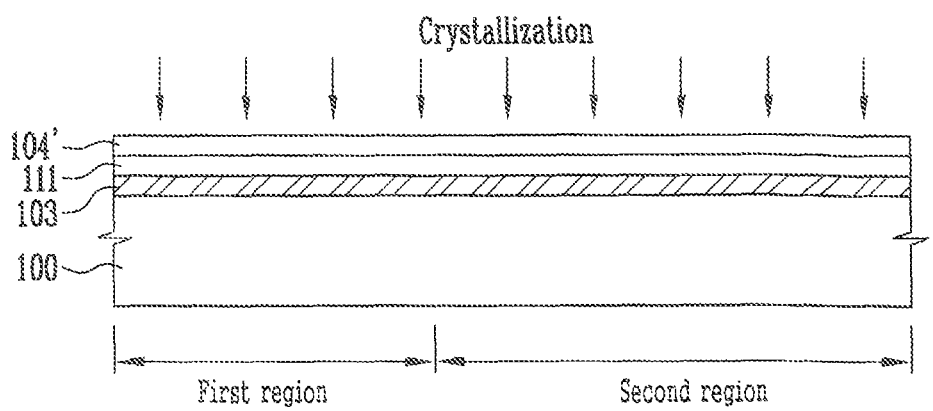

Referring to FIG. 3C, a crystallization process is performed with respect to second amorphous silicon layer 104 (step 330). Through the crystallization process, second amorphous silicon layer 104 is formed into a second poly-silicon layer 104'.

Figure 3D:
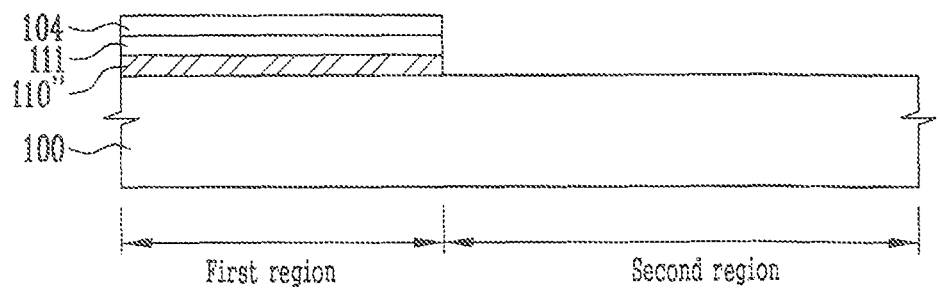

Referring to FIG. 3D, first poly-silicon layer 103, buffer layer 111 and second poly-silicon layer 104' are patterned through an etching process (step 340). Through the etching process, first amorphous silicon layer 102, buffer layer 111, poly-silicon layer 104' remain in a first area in which a transistor is formed, and substrate 100 is exposed in a second area that is a transmission region.

The patterned first poly-silicon layer 103 serves as a light shielding layer 110". The patterned second poly-silicon layer 104' is used as a semiconductor layer 112 of the transistor.

According to the embodiment of the present invention, light shielding layer 110" and semiconductor layer 112 are formed of the same poly-silicon. Thus, light shielding layer 110" absorbs light with the same absorption wavelength band as the light applied to semiconductor layer 112, thereby obtaining a more effective light shielding effect. This can be seen through the graph of FIG. 4.

FIG. 4 is a graph showing transmittances of poly-silicon and amorphous silicon. In FIG. 4, the horizontal axis indicates the wavelength ($\lambda$) of transmitted light, and the vertical axis indicates the transmittance.

Referring to FIG. 4, the curve represented by "a" shows the transmittance of poly-silicon based on the wavelength of light, and the curve represented by "b" shows the transmittance of amorphous silicon based on the wavelength of light. Accordingly, it can be seen that the amorphous silicon and the poly-silicon have different transmission spectra from each other for each wavelength.

As described above, a portion at which light leakage current occurs in the transistor is the active region of the semiconductor layer formed of poly-silicon. Therefore, when the light shielding layer is formed of poly-silicon like the semiconductor layer, light with the same absorption wavelength band is absorbed at the lower portion of the semiconductor layer, thereby obtaining a more effective light shielding effect.

According to FIG. 3D, it is possible to remove buffer layer 111 that causes the lowering of transmittance in the second region that is the transmission region, thereby improving the transmittance of the display device.

Also, light shielding layer 110" is formed through the etching process like semiconductor layer 112, so that an additional mask process can be removed as compared with the related art process of forming a light shielding layer. Therefore, it is advantageous in view of process simplification.

Figure 3E:
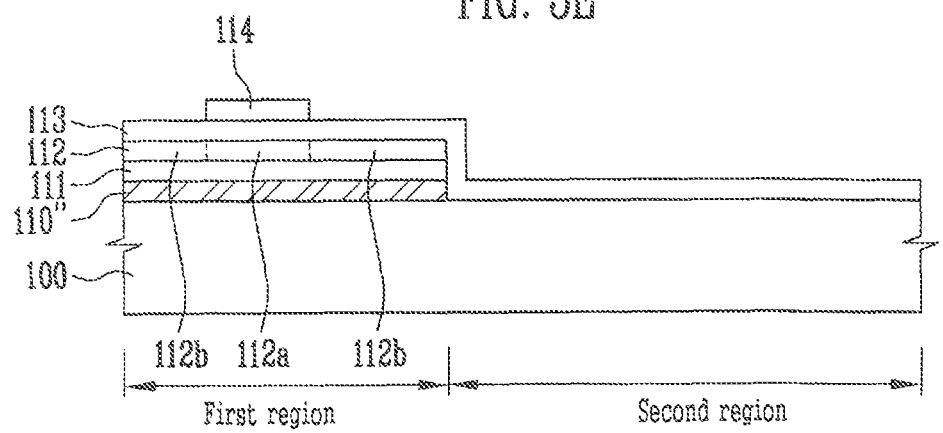

Referring to FIG. 3E, a first insulating layer 113 is formed on the entire surface of substrate 100 on which semiconductor layer 112 is formed. A gate electrode 114 is formed on first insulating layer 113 overlapped with semiconductor layer 112 (step 350).

A doping process is performed using gate electrode 114 as a mask. Accordingly, semiconductor layer 112 has an active region 112a overlapped with gate electrode 114 and source and drain regions 112b doped at both sides of active region 112a (step 350).

Figure 3F:
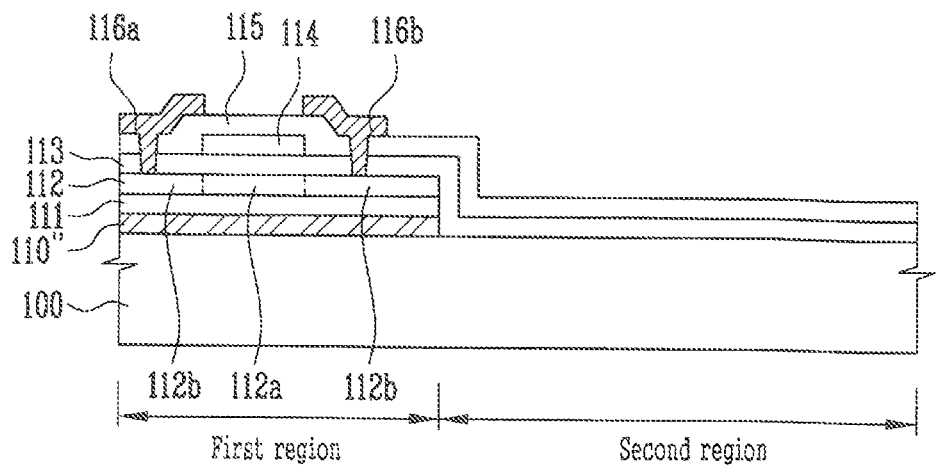

Referring to FIG. 3F, a second insulating layer 115 is formed on substrate 100 on which gate electrode 114 is formed. Source and drain electrodes 116a and 116b are formed on upper portions of second insulating layer 115, overlapped with source and drain regions 112b of semiconductor layer 112, respectively (step 360). At this time, source and drain electrodes 116a and 116b are electrically connected to source and drain regions 112b through contact holes that are corresponding to source and drain regions 112b and are formed in first and second insulating layers 113 and 115, respectively.

Figure 3G:
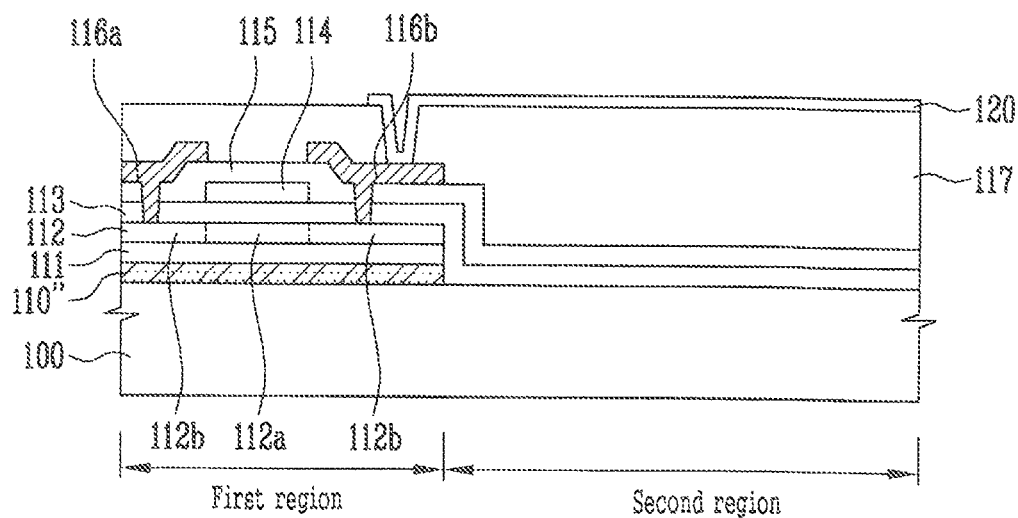

Referring to FIG. 3G, a third insulating layer 117 is formed on source and drain electrodes 116a and 116b. A contact hole is formed in a partial region of third insulating layer 117 overlapped with drain electrode 116b, so that an electrode 120 made of a transparent conductive material is electrically connected to drain electrode 116b of the transistor through the contact hole (step 370). At this time, electrode 120 is formed in a second region that is a transmission region as shown in this figure.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display device, comprising:
    a transistor positioned in a first region on a substrate;
    an electrode positioned in a second region on the substrate to be electrically connected to the transistor; and
    a light shielding layer formed below the transistor in the first region and directly on the substrate,
    the light shielding layer being formed of a semiconductor material, the semiconductor material being a metal oxide material or an organic material.

2. The display device of claim 1, wherein the transistor comprises:
    a semiconductor layer having source, channel, and drain regions;
    a gate electrode spaced apart from the channel region while disposed in correspondence with the channel region; and
    a gate insulating layer positioned between the channel region and the gate electrode; and
    the light shielding layer being formed of a material identical to a semiconductor material included in the semiconductor layer.

3. The display device according to claim 2, further comprising a buffer layer positioned between the semiconductor layer and the light shielding layer.

4. A display device, comprising:
    a transistor positioned in a first region on a substrate;
    an electrode positioned in a second region on the substrate to be electrically connected to the transistor; and
    a light shielding layer formed of a semiconductor material below the transistor in the first region and directly on the substrate, the semiconductor material being a metal oxide material or an organic material,
    the transistor comprising:
        a semiconductor layer having source, channel, and drain regions;
        a gate electrode spaced apart from the channel region while disposed in correspondence with the channel region; and
        a gate insulating layer positioned between the channel region and the gate electrode; and
        a side etched surface of the light shielding layer being disposed in the same plane with a side etched surface of the semiconductor layer.

5. The display device according to claim 4, further comprising a buffer layer positioned between the semiconductor layer and the light shielding layer.

6. The display device according to claim 5, wherein a side etched surface of the buffer layer is disposed in the same plane with the side etched surface of the light shielding layer and the side etched surface of the semiconductor layer.

7. A method of manufacturing a display device, the method comprising:
    sequentially forming a semiconductor layer made of metal oxide material or an organic material directly on a substrate, a buffer layer on the semiconductor layer, and an amorphous silicon layer on the buffer layer;
    performing a crystallization process with respect to the amorphous silicon layer, thereby forming the amorphous silicon layer into a poly-silicon layer;
    patterning the semiconductor layer, the buffer layer and the poly-silicon layer through an etching process, thereby forming a light shielding layer from the semiconductor layer, and a semiconductor active layer of a transistor from the poly-silicon layer, with the light shielding layer, the buffer layer and the semiconductor active layer being disposed in a first region on the substrate;
    forming a gate electrode in a region overlapped with the semiconductor active layer and forming source and drain electrodes that electrically contact source and drain regions of the semiconductor active layer, respectively; and
    forming a pixel electrode in a second region on the substrate to be electrically connected to the drain electrode.

8. The method according to claim 7, wherein the crystallization process is performed using excimer laser annealing (ELA), sequential lateral solidification (SLS), metal induced crystallization (MIC) or metal induced lateral crystallization (MILC).

9. The method according to claim 7, wherein the semiconductor layer, the buffer layer and the poly-silicon layer remain in the first region in which the transistor is formed through the etching process, and the substrate is exposed in the second region that is a light transmission region.

10. The method according to claim 7, wherein the patterned semiconductor layer becomes the light shielding layer, and the patterned poly-silicon layer becomes the semiconductor active layer of the transistor.

* * * * *